US008450859B2

(12) United States Patent
Ohashi et al.

(10) Patent No.: US 8,450,859 B2
(45) Date of Patent: May 28, 2013

(54) SEMICONDUCTOR DEVICE MOUNTED STRUCTURE AND ITS MANUFACTURING METHOD

(75) Inventors: Naomichi Ohashi, Hyogo (JP); Shigeaki Sakatani, Osaka (JP); Arata Kishi, Osaka (JP); Atsushi Yamaguchi, Osaka (JP); Hidenori Miyakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 207 days.

(21) Appl. No.: 13/000,391

(22) PCT Filed: Oct. 27, 2009

(86) PCT No.: PCT/JP2009/005662
§ 371 (c)(1),
(2), (4) Date: Dec. 21, 2010

(87) PCT Pub. No.: WO2010/050185
PCT Pub. Date: May 6, 2010

(65) Prior Publication Data
US 2011/0095423 A1 Apr. 28, 2011

(30) Foreign Application Priority Data

Oct. 27, 2008 (JP) ................................. 2008-275109

(51) Int. Cl.
*H01L 23/48* (2006.01)
*H01L 23/52* (2006.01)
*H01L 29/40* (2006.01)

(52) U.S. Cl.
USPC ........................................................ 257/779

(58) Field of Classification Search
USPC ................................................. 257/779–781
See application file for complete search history.

(56) References Cited

U.S. PATENT DOCUMENTS 6,316,528 B1    11/2001  Iida et al.
6,590,287 B2 *   7/2003  Ohuchi ......................... 257/738
(Continued)

FOREIGN PATENT DOCUMENTS

JP    10-101906    4/1998
JP    10-158366    6/1998
(Continued)

OTHER PUBLICATIONS

International Search Report issued Dec. 28, 2009 in International (PCT) Application No. PCT/JP2009/05662.

(Continued)

*Primary Examiner* — Jenny L Wagner
(74) *Attorney, Agent, or Firm* — Wenderoth, Lind & Ponack, L.L.P.

(57) ABSTRACT

A semiconductor device mounted structure includes a semiconductor device having a plurality of first electrodes, a circuit board having a plurality of second electrodes, a plurality of bumps respectively formed on the plurality of first electrodes, a plurality of bonding members respectively positioned between the bumps and the second electrodes to electrically connect the first electrodes to the second electrodes via the bumps, and a plurality of reinforcing resin members respectively positioned around the bonding members so as to cover at least the bonding members and bonding regions between the bonding members and the bumps. Adjacent reinforcing resin members are spaced away from each other so as not to have contact with each other without being in contact with the semiconductor device. This semiconductor device mounted structure enhances the reliability of joints in impact resistance and makes it easy to repair it.

12 Claims, 4 Drawing Sheets

U.S. PATENT DOCUMENTS

| | | |
|---|---|---|
| 2001/0013653 A1 | 8/2001 | Shoji |
| 2002/0017725 A1 | 2/2002 | Isozaki |
| 2002/0033525 A1 | 3/2002 | Ohuchi |
| 2002/0046856 A1 | 4/2002 | Alcoe |
| 2003/0068847 A1 | 4/2003 | Watanabe et al. |
| 2006/0076692 A1* | 4/2006 | Lee et al. .................. 257/778 |

FOREIGN PATENT DOCUMENTS

| | | |
|---|---|---|
| JP | 10-204259 | 8/1998 |
| JP | 10-335336 | 12/1998 |
| JP | 2000-58709 | 2/2000 |
| JP | 2000-340707 | 12/2000 |
| JP | 2002-026070 | 1/2002 |
| JP | 2002-50717 | 2/2002 |
| JP | 2002-118209 | 4/2002 |
| JP | 2002-299518 | 10/2002 |
| JP | 2003-100948 | 4/2003 |
| JP | 2003-158223 | 5/2003 |
| JP | 2003-273500 | 9/2003 |
| JP | 2005-064303 | 3/2005 |
| JP | 2005-142497 | 6/2005 |
| JP | 2008-258318 | 10/2008 |
| WO | 98/31738 | 7/1998 |

OTHER PUBLICATIONS

English translation of International Preliminary Report on Patentability and Written Opinion of the International Searching Authority, issued Jun. 16, 2011 in PCT/JP2009/05662.

* cited by examiner

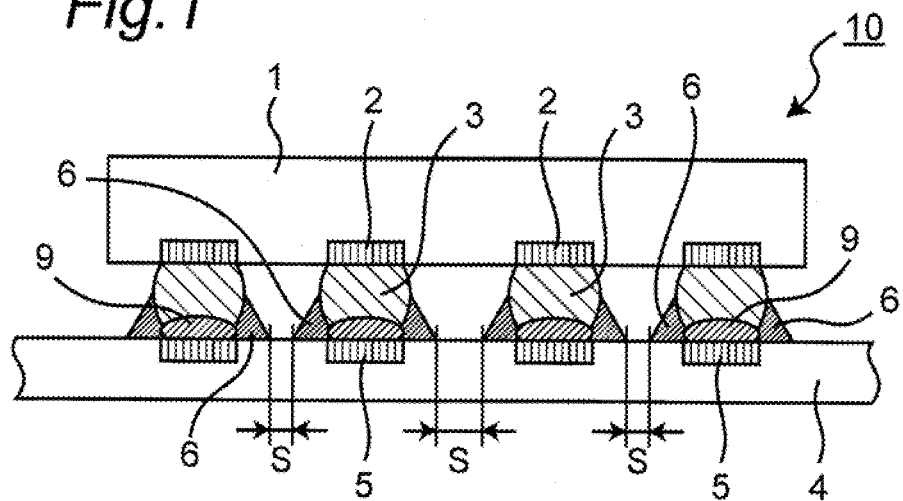
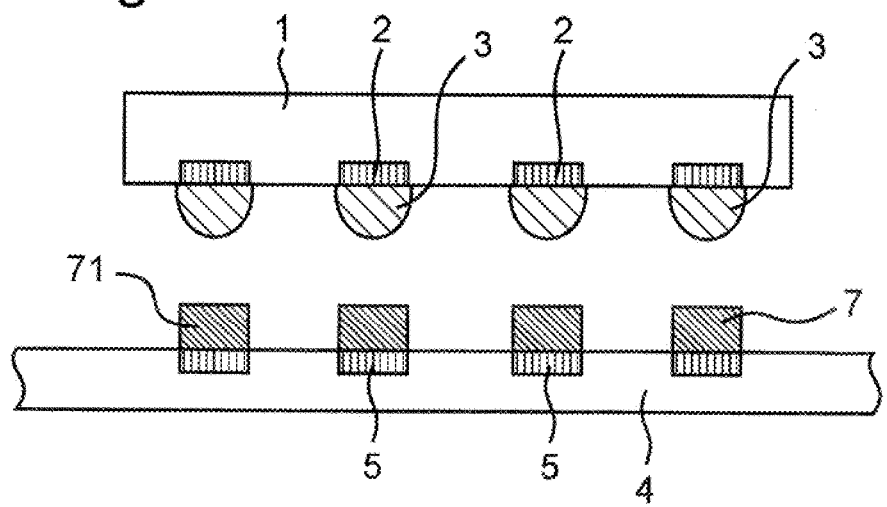

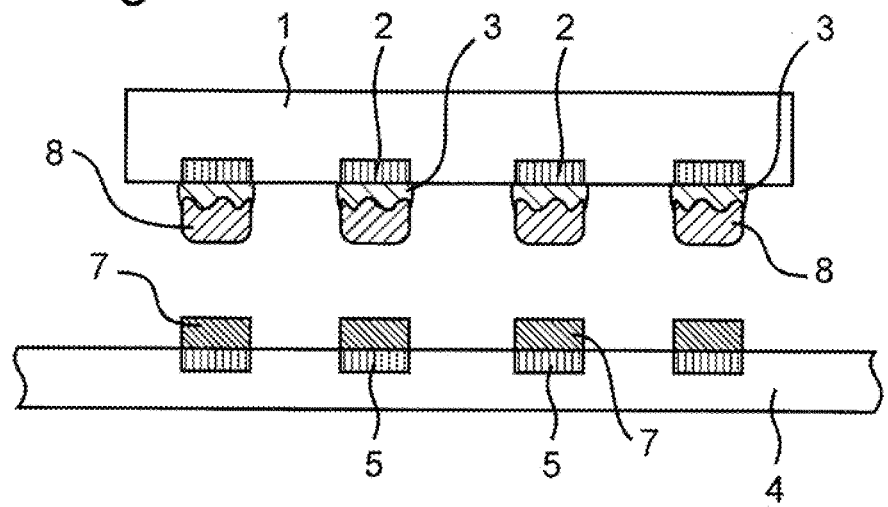
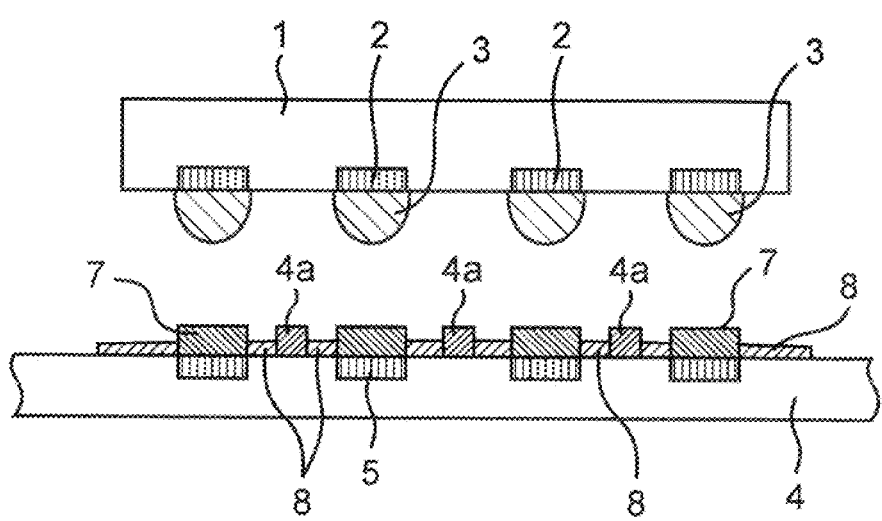

Fig.5

| NUMBER | COMPOSITION OF SOLDER BUMP (MELTING POINT) | COMPOSITION OF SOLDERING PASTE (MELTING POINT) | MAXIMUM REFLOW ACHIEVING TEMPERATURE | PERCENTAGE OF REINFORCING RESIN HEIGHT | DROP LIFE | ACCEPTABILITY IN DROP LIFE | REPAIRING CAPABILITY | OVERALL JUDGMENT |
|---|---|---|---|---|---|---|---|---|
| EXAMPLE 1 | SnAgCu (219°C) | SnBi (138°C) | 155°C | 15% | 40 TIMES | △ | ○ | △ |
| EXAMPLE 2 | SnAgCu (219°C) | SnBi (138°C) | 155°C | 20% | MORE THAN 60 TIMES | △ | ○ | △ |
| EXAMPLE 3 | SnAgCu (219°C) | SnBi (138°C) | 155°C | 30% | MORE THAN 80 TIMES | ○ | ○ | ○ |
| EXAMPLE 4 | SnAgCu (219°C) | SnBi (138°C) | 155°C | 50% | MORE THAN 100 TIMES | ○ | ○ | ○ |
| EXAMPLE 5 | SnAgCu (219°C) | SnBi (138°C) | 155°C | 60% | MORE THAN 100 TIMES | ○ | ○ | ○ |
| EXAMPLE 6 | SnAgCu (219°C) | SnBi (138°C) | 155°C | 80% | MORE THAN 100 TIMES | ○ | △ | △ |
| COMPARATIVE EXAMPLE 1 | SnAgCu (219°C) | SnBi (138°C) | 155°C | 5% | 20 TIMES | × | ○ | × |
| COMPARATIVE EXAMPLE 2 | SnAgCu (219°C) | SnBi (138°C) | 155°C | 10% | 25 TIMES | × | ○ | × |
| COMPARATIVE EXAMPLE 3 | SnAgCu (219°C) | SnBi (138°C) | 155°C | 100% | MORE THAN 100 TIMES | ○ | × | × |
| COMPARATIVE EXAMPLE 4 | SnAgCu (219°C) | SnBi (138°C) | 155°C | 0% | LESS THAN 10 TIMES | × | ○ | × |

(NOTE) ○ : ACCEPTANCE,  △ : ALLOWABLE,  × : REJECTION

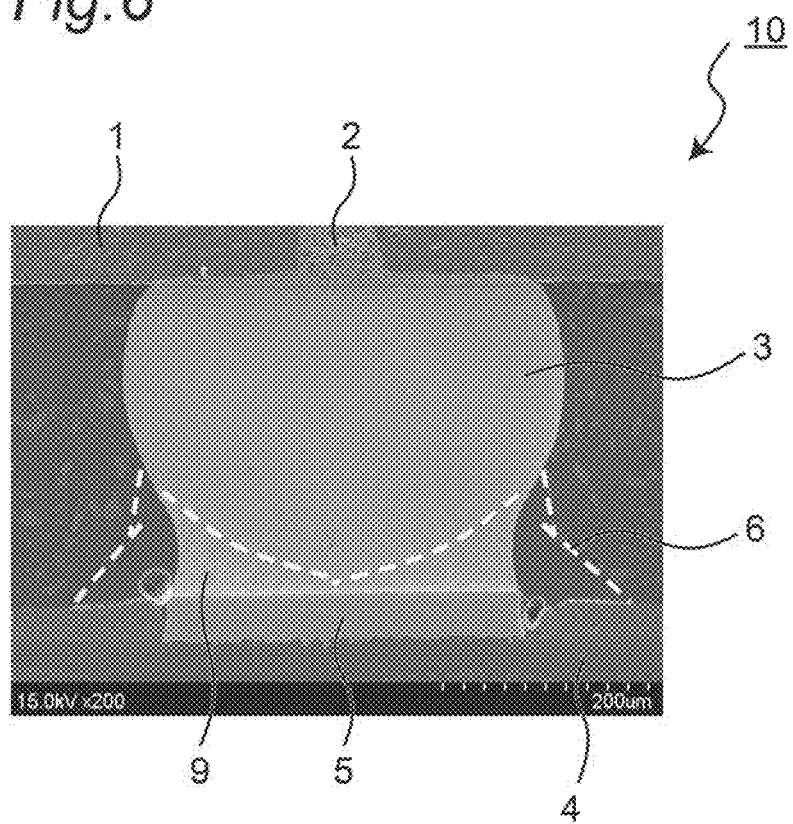

SEMICONDUCTOR DEVICE MOUNTED STRUCTURE AND ITS MANUFACTURING METHOD

TECHNICAL FIELD

The present invention relates to a semiconductor device mounted structure in which a semiconductor device such as, for example, a semiconductor chip (semiconductor element) or a semiconductor package is electrically connected to a circuit board. The present invention also relates to a manufacturing method of the semiconductor device mounted structure.

BACKGROUND ART

Mobile devices such as mobile phones, PDAs (Personal Digital Assistants), and the like are nowadays progressively reduced in size and sophisticated, and a mounted structure such as a BGA (Ball Grid Array) or CSP (Chip Scale Package) is widely used to respond to such a trend. Because the mobile devices are susceptible to mechanical load such as drop impact, it is important for the mounted structure such as a BGA or CSP not having any impact relieving structure such as leads of a QFP (Quad Flat Package) to ensure the reliability of soldered joints in impact resistance.

In soldering, for example, a BGA semiconductor package and an electronic circuit board, a sealing and reinforcing technique such as an underfill for enhancing the reliability of soldered joints in impact resistance has been hitherto used in which a reinforcing resin material is filled, after soldering, in a space between the BGA semiconductor package and the electronic circuit board for fixation thereof to thereby relieve stress that may be caused by heat or mechanical impact. A thermosetting type epoxy resin has been mainly used as a conventional underfill sealing agent (see Patent Document 1, 2 or 3).

In recent years, growing concern about global environmental problems leads to practical use of solders containing no lead, i.e., Pb-free solders. Of the Pb-free solders, an Sn—Ag—Cu-based solder is nowadays widely used having relatively good wettability or high connection reliability. In addition to the Sn—Ag—Cu-based solder, a low-melting-point Pb-free solder such as, for example, an Sn—Zn-based solder, an Sn—Ag—In-based solder or an Sn—Bi-based solder begins to be used that is free from a demerit of a high melting point, as is the case with the Sn—Ag—Cu-based solder. However, the reliability in BGA connection with the use of the Sn—Zn-based solder, Sn—Ag—In-based solder or Sn—Bi-based solder is still unclear.

Patent Document 1: JP 10-101906 A
Patent Document 2: JP 10-158366 A
Patent Document 3: JP 10-204259 A

DISCLOSURE OF INVENTION

Problems to be Solved by the Invention

In the reinforcing structure by underfill sealing as disclosed in Patent Document 1 or 2, the BGA semiconductor package and the circuit board are completely secured to each other via the reinforcing resin material. Accordingly, if a failure within the BGA semiconductor package or poor connection between the BGA semiconductor package and the circuit board occurs (or is discovered), the fixation by the reinforcing resin material cannot be released, i.e., the BGA semiconductor package and the circuit board cannot be easily separated, thus making it considerably difficult to exchange BGA semiconductor packages. That is, a thermosetting resin is used as the reinforcing resin material and cannot be accordingly sufficiently melted at temperatures below an operating temperature limit of the BGA semiconductor package, thus making it difficult to peel the reinforcing resin material.

In view of this, Patent Document 3 has proposed use of an adhesive free from the aforementioned problem and having a repairing capability (that is, exchangeability of the BGA semiconductor packages by separation of the BGA semiconductor package and the circuit board). Patent Document 3 discloses a thermosetting resin composition for underfill sealing employed as the adhesive having a good repairing capability. According to Patent Document 3, addition of a plasticizer to a one- or two-liquid epoxy resin enables short-time thermosetting, and allows a semiconductor device such as a CSP or BGA to be connected to a wiring board. Moreover, the thermosetting resin composition as disclosed in Patent Document 3 is superior in heat shock properties and allows easy removal of the CSP or BGA if a failure has been discovered.

However, the use of the plasticizer is indispensable to the composition as disclosed in Patent Document 3, thus posing a problem that the strength of the resin, i.e., the durability, heat resistance or heat cycle resistance lowers, and bleeding of the plasticizer from a hardened material contaminates the surroundings.

The present invention has been developed to overcome the above-described disadvantages.

It is accordingly an objective of the present invention to provide a semiconductor device mounted structure, in which a semiconductor device such as, for example, a semiconductor chip or a semiconductor package is electrically connected to a circuit board, capable of enhancing the reliability of joints in impact resistance and facilitating repairs to the semiconductor device mounted structure. The present invention also provide a manufacturing method of the semiconductor device mounted structure.

Means to Solve the Issues

In order to achieve the above object, the present invention has the following constitutions.

According to a first aspect of the present invention, there is provided a semiconductor device mounted structure, comprising:

a semiconductor device having a plurality of first electrodes;

a circuit board having a plurality of second electrodes;

a plurality of bumps respectively formed on the plurality of first electrodes;

a plurality of bonding members respectively positioned between the bumps and the second electrodes to electrically connect the first electrodes to the second electrodes via the bumps; and a plurality of reinforcing resin members respectively positioned around the bonding members so as to cover at least the bonding members and bonding regions between the bonding members and the bumps;

wherein adjacent reinforcing resin members are spaced away from each other so as not to have contact with each other without being in contact with the semiconductor device.

According to a second aspect of the present invention, there is provided the semiconductor device mounted structure according to the first aspect, wherein the bumps and the bonding members have alloy composition including a combination of Sn and one or more elements selected from the group consisting of Bi, In, Ag, Zn, and Cu.

According to a third aspect of the present invention, there is provided the semiconductor device mounted structure according to the second aspect, wherein the bonding members have a melting point less than that of a soldering material used for the bumps by 10 degrees C. or more.

According to a fourth aspect of the present invention, there is provided the semiconductor device mounted structure according to the third aspect, wherein the bumps are made of an Sn—Ag—Cu-based soldering material, and the bonding members are made of an Sn—Bi-based soldering material.

According to a fifth aspect of the present invention, there is provided the semiconductor device mounted structure according to the fourth aspect, wherein a percentage (H/D) of a height H of the reinforcing resin members to a distance D between the first electrodes and the second electrodes is greater than 15%.

According to a sixth aspect of the present invention, there is provided the semiconductor device mounted structure according to any one of the first through fifth aspects, further comprising a plurality of protrusions formed on the circuit board between the board electrodes to avoid contact of each reinforcing resin member with the reinforcing resin members adjacent thereto.

According to a seventh aspect of the present invention, there is provided the semiconductor device mounted structure according to any one of the first through fifth aspects, wherein each of the bonding members has an outer peripheral surface in the form of an inwardly curved ring and entirely filled with an associated one of the reinforcing resin members.

According to an eighth aspect of the present invention, there is provided the semiconductor device mounted structure according to any one of the first through fifth aspects, further comprising another resin material positioned between the semiconductor device and the circuit board so as to cover the first electrodes, the second electrodes, the bumps, and the reinforcing resin members.

According to a ninth aspect of the present invention, there is provided a manufacturing method of a semiconductor device mounted structure, comprising:

applying a mixed paste containing a reinforcing resin material and a soldering material to a plurality of second electrodes formed on a circuit board;

placing each of a plurality of solder bumps respectively formed on a plurality of first electrodes of a semiconductor device on one of the plurality of second electrodes of the circuit board via the mixed paste; and heating the mixed paste to separate the reinforcing resin material and the soldering material from each other and electrically connect the first electrodes to the second electrodes via the soldering material and the solder bumps, respectively, such that the reinforcing resin material is placed around the soldering material so as to cover at least the soldering material and a bonding region between the soldering material and an associated one of the solder bumps.

According to a tenth aspect of the present invention, there is provided a manufacturing method of a semiconductor device mounted structure, comprising:

applying a soldering material in the form of paste to a plurality of second electrodes formed on a circuit board;

applying a reinforcing resin material to a plurality of solder bumps respectively formed on a plurality of first electrodes of a semiconductor device;

placing the reinforcing resin material, formed on the solder bumps of the semiconductor device, on the soldering material of the circuit board; and heating the reinforcing resin material and the soldering material to electrically connect the first electrodes to the second electrodes via the soldering material and the solder bumps, respectively, such that the reinforcing resin material is placed around the soldering material so as to cover at least the soldering material and a bonding region between the soldering material and an associated one of the solder bumps.

According to an eleventh aspect of the present invention, there is provided the manufacturing method of a semiconductor device mounted structure according to the ninth or tenth aspect, wherein the soldering material has a melting point less than that of a material used for the solder bumps by 10 degrees C. or more such that when the soldering material is heated, the soldering material is melted with the solder bumps not melted.

Effect of the Invention

In the semiconductor device mounted structure according to the present invention, because the plurality of reinforcing resin members are respectively positioned around the bonding members so as to cover at least the bonding members and bonding regions between the bonding members and the bumps, the bonding members and the bonding regions between the bonding members and the bumps can be positively reinforced by the reinforcing resin members. Also, because the reinforcing resin members are positioned so as to cover the bonding members and the bonding regions between the bonding members and the bumps without being in contact with the semiconductor device, repairs to the semiconductor device mounted structure can be easily carried out, compared with a conventional structure in which a space between the semiconductor device and the circuit board is sealed with a resinous material. Such repairs can be carried out by remelting the bonding members to release the connection of the bumps and the second electrodes.

Further, because each reinforcing resin member is spaced away from the reinforcing resin members adjacent thereto so as not to have contact therewith, even if a microcrack is produced in the reinforcing resin, and a remelted bonding material flows out through the microcrack by capillary action, short-circuiting between adjacent electrodes can be positively prevented.

Accordingly, the semiconductor device mounted structure according to the present invention can enhance the reliability of joints in impact resistance and facilitate repairs to the semiconductor device mounted structure.

BRIEF DESCRIPTION OF THE DRAWINGS

These aspects and features of the present invention will become clear from the following description taken in conjunction with the preferred embodiments thereof with reference to the accompanying drawings, in which:

FIG. 1 is a sectional view of a semiconductor package-mounted structure according to a first embodiment of the present invention.

FIG. 2 is a view showing a manufacturing method of a semiconductor package-mounted structure (first mounting method) according to a second embodiment of the present invention.

FIG. 3 is a view showing a manufacturing method of a semiconductor package-mounted structure (second mounting method) according to the second embodiment of the present invention.

FIG. 4 is a view showing a manufacturing method of a semiconductor package-mounted structure (third mounting method) according to the second embodiment of the present invention.

FIG. 5 is a table showing measurement results of the semiconductor package-mounted structures according to the present invention and those according to comparative examples.

FIG. 6 is a sectional view of a bonding region of the semiconductor package-mounted structure according to the present invention.

EMBODIMENTS FOR CARRYING OUT THE INVENTION

Before the present invention is discussed, it is to be noted that like parts are designated by like reference numerals in the attached drawings.

Embodiments of the present invention are hereinafter discussed in detail with reference to the drawings.

First Embodiment

FIG. 1 is a schematic partial sectional view of a structure 10 on which a semiconductor package 1 obtained by a mounting method according to a first embodiment of the present invention has been mounted. The term "semiconductor package" as employed throughout this application is defined as an example of a semiconductor device and includes a single semiconductor device or a package having a semiconductor device. As shown in FIG. 1, the semiconductor package-mounted structure 10 includes a BGA semiconductor package 1 having a plurality of electrodes 2, a plurality of solder bumps 3 each formed on one of the electrodes 2, a circuit board 4 having a plurality of board electrodes (an example of a second electrode) 5, a plurality of bonding members 9 each interposed between one of the solder bumps 3 and an associated one of the board electrodes 5 for electrical connection thereof, and a plurality of reinforcing resins (reinforcing resinous members) 6 each formed around one of the bonding members 9 to reinforce it.

In the illustrated structure 10, the solder bump 3 is secured to the electrode 2 of the semiconductor package 1, and the reinforcing resin 6 is positioned around the bonding member 9 to cover the bonding member 9 and a bonding region (bonding interface) between the bonding member 9 and the solder bump 3. Also, adjacent reinforcing resins 6 are spaced away from each other so as not to have contact with each other. That is, a space S is provided between adjacent reinforcing resins 6 to avoid contact of the reinforcing resins 6. The space S may be set to a constant value or individually set depending on an interval between the reinforcing resins 6. The reinforcing resin 6 is positioned so as not to be in contact with the semiconductor package 1 and, hence, covers only a portion of the solder bump 3, and not the entire solder bump 3. Moreover, the reinforcing resin 6 is in the form of a fillet that broadens toward the board electrode 5 of the circuit board 4.

In the semiconductor package-mounted structure 10 of the above-described configuration, because the reinforcing resin 6 is positioned around the bonding member 9 to cover the bonding member 9 and the bonding region (bonding interface) between the bonding member 9 and the solder bump 3, the bonding member 9 itself and the bonding region between the bonding member 9 and the solder bump 3 can be positively reinforced by the reinforcing resin 6. Also, because the reinforcing resin 6 covers the bonding member 9 and the bonding region between the bonding member 9 and the solder bump 3 without making contact with the BGA semiconductor package 1, repairs to the structure 10 or the BGA semiconductor package 1 can be easily made, as compared with a conventional structure in which a resinous material sealant is interposed between the BGA semiconductor package 1 and the circuit board 4. Such repairs can be made by remelting the bonding member 9 to release the connection between the solder bump 3 and the board electrode 5.

Furthermore, because adjacent reinforcing resins 6 are separated by the space S so as not to have contact with each other, even if a microcrack is produced in the reinforcing resin 6, and a remelted bonding material (for example; a soldering material) flows out through the microcrack by capillary action, short-circuiting between adjacent board electrodes 5 can be positively prevented.

In addition, because the reinforcing resin 6 takes the form of a fillet that broadens toward the circuit board 4 to partially cover a surface of the board electrode 5 and that of the circuit board 4, even if the semiconductor package-mounted structure 10 is subject to thermal shock or mechanical shock, the reinforcing resin 6 acts to suppress deformation of the circuit board 4, thus making it possible to enhance the shock resistance of the structure 10.

Accordingly, in the semiconductor package-mounted structure 10, both the reliability of soldered joints in shock or impact resistance and the repairing capability of the BGA semiconductor package 1 can be enhanced.

The construction, material specification and the like of the semiconductor package-mounted structure 10 are further explained in detail.

Although in the above-described embodiment the semiconductor package 1 has been explained as being a BGA semiconductor package having a BGA semiconductor, the former is not limited by the latter and may be any semiconductor device having a solder bump.

The solder bump 3 may be a single tin alloy or a mixture of tin alloys having alloy composition selected from the group consisting of, for example, an Sn—Bi-based alloy, an Sn—In-based alloy, an Sn—Bi—In-based alloy, an Sn—Ag-based alloy, an Sn—Cu-based alloy, an Sn—Ag—Cu-based alloy, an Sn—Ag—Bi-based alloy, an Sn—Cu—Bi-based alloy, an Sn—Ag—Cu—Bi-based alloy, an Sn—Ag—In-based alloy, an Sn—Cu—In-based alloy, an Sn—Ag—Cu—In-based alloy, and an Sn—Ag—Cu—Bi—In-based alloy. It is preferred that the solder bump 3 has alloy composition including a combination of Sn and one or more elements selected from the group consisting of Bi, In, Ag, Zn, and Cu.

The reinforcing resin 6 is a thermosetting resin such as, for example, an epoxy resin, an urethane resin, an acryl resin, a polyimide resin, a polyamide resin, a bismaleimide resin, a phenol resin, a polyester resin, a silicone resin, an oxetane resin, or any other suitable thermosetting resin. The reinforcing resin 6 may be a combination of two or more such resins. Of these resins, the epoxy resin is particularly preferred.

An epoxy resin selected from the group consisting of a bisphenol-type epoxy resin, a polyfunctional epoxy resin, a flexible epoxy resin, a brominated epoxy resin, a glycidyl ester-type epoxy resin, and a polymer-type epoxy resin can be also used. For example, a bisphenol A-type epoxy resin, a bisphenol F-type epoxy resin, a bisphenol S-type epoxy resin, a biphenyl-type epoxy resin, a naphthalene-type epoxy resin, a phenol novolac-type epoxy resin, or a cresol novolac-type epoxy resin is preferably used. An epoxy resin obtained by modifying one of them is also used. Such epoxy resins may be used solely, or two or more such epoxy resins may be combined.

A curing agent is used in combination with the thermosetting resin referred to above. As the curing agent, a compound selected from the group consisting of a thiol compound, a modified amine compound, a polyfunctional phenol compound, an imidazole compound, and an acid anhydride compound is preferably used. Such compounds may be used solely, or two or more such compounds may be combined. A preferred curing agent is selected depending on the environment of usage of conductive paste or the intended use.

As occasion demands, an organic or inorganic viscosity controlling and thixotropy-imparting additive may be used. By way of example, silica, alumina or the like is used as an inorganic viscosity controlling and thixotropy-imparting additive, while a solid epoxy resin, low-molecular-weight amide, polyester, an organic derivative of castor oil, or the like is used as an organic viscosity controlling and thixotropy-imparting additive. Such additives may be used solely, or two or more such additives may be combined.

The BGA semiconductor package 1 used in the first embodiment referred to above has a size of, for example, 11 mm×11 mm, and the number of the solder bumps 3 is 441 at intervals of 0.5 mm. The circuit board 4 has a size of 3 cm×7 cm and a thickness of 0.8 mm. The material of the electrodes 5 is copper, and the material of the circuit board 4 is glass epoxy.

Second Embodiment

The second embodiment pertains to a mounting method for a semiconductor package 1 embodying one form of the present invention, i.e., a manufacturing method of the semiconductor package-mounted structure 10. Three patterns of mounting methods (manufacturing methods) are explained with reference to FIGS. 2, 3 and 4, respectively. Component parts that are substantially the same as those of the structure 10 shown in FIG. 1 are designated by the same reference numerals, and explanation thereof is omitted for the sake of brevity.

(First Mounting Method)

The first mounting method is first explained. As shown in FIG. 2, a pattern of mixed paste 71 (mixed paste in which a soldering material and a thermosetting resin have been mixed) is printed on the board electrodes 5 of the circuit board 4. A typical example of the mixed paste includes a soldering material of alloy composition consisting of a combination of Sn and one or more elements selected from the group consisting of Bi, In, Ag and Cu, and an uncured thermosetting resin. In a subsequent process for mounting the BGA semiconductor package 1 on the circuit board 4, the pattern of mixed paste 71, printed on the board electrodes 5 of the circuit board 4, is aligned with the solder bumps 3 respectively formed on the electrodes 2 of the BGA semiconductor package 1 such that the mixed paste 71 is brought into contact with the solder bumps 3.

Thereafter, the soldering material is melted by heating the mixed paste 71, in which the soldering material and the thermosetting resin have been mixed, using a reflow soldering device. The melted soldering material in the mixed paste 71 wets surfaces of the solder bumps 3 and those of the board electrodes 5 (metal diffusion state), thus resulting in separation of the soldering material and the thermosetting resin in the mixed paste 71. The thermosetting resin so separated is then displaced around the soldering material. Thereafter, the thermosetting resin is thermally cured to turn into the reinforcing resins 6, while the soldering material solidifies and turns into the bonding members 9, which in turn electrically connect each of the solder bumps 3 with an associated one of the board electrodes 5. Each reinforcing resin 6 covers the bonding member 9 and a bonding region between the bonding member 9 and the solder bump 3 to reinforce them. For this purpose, it is preferred that the amount of mixed paste 71 printed on the board electrodes 5 of the circuit board 4 be controlled. The control of the amount of mixed paste 71 is also intended to separate each reinforcing resin 6 from the reinforcing resins 6 adjacent thereto without being in contact with the semiconductor package 1.

In the manner hereinabove described, the structure 10 on which the BGA semiconductor package 1 according to the first embodiment as shown in FIG. 1 has been mounted can be formed by the first mounting method.

(Second Mounting Method)

Next, the second mounting method is explained. As shown in FIG. 3, a pattern of soldering paste 7 is printed on the board electrodes 5 of the circuit board 4. A typical example of the soldering paste 7 has alloy composition consisting of a combination of Sn and one or more elements selected from the group consisting of Bi, In, Ag and Cu. An uncured thermosetting resin 8 is then transferred on the solder bumps 3 of the BGA semiconductor package 1 that have alloy composition consisting of a combination of Sn and one or more elements selected from the group consisting of Bi, In, Ag, Zn and Cu. During transfer of the thermosetting resin, the resin is spread out to a uniform thickness of 0.1 mm to 1 mm using a squeegee, and the solder bumps 3 of the BGA semiconductor package 1 are then placed on the thermosetting resin.

The amount of transfer of the thermosetting resin 8 can be controlled by controlling the thickness of the resin spread out with the squeegee or the depth by which the solder bumps 3 of the BGA semiconductor package 1 are pressed against the resin. More specifically, the control of the amount of transfer of the thermosetting resin 8 is conducted so that after completion of mounting, the thermosetting resin (reinforcing resin 6) can cover the bonding members 9 and the bonding regions between the bonding members 9 and the solder bumps 3, and each reinforcing resin 6 can be separated from the reinforcing resins 6 adjacent thereto without being in contact with the semiconductor package 1.

Thereafter, the BGA semiconductor package 1 is mounted on the circuit board 4, and the soldering paste 7 is melted for subsequent soldering with the use of a reflow soldering device. At the same time, curing of the thermosetting resin is completed. By doing so, the soldering paste 7 solidifies and turns into the bonding members 9, which in turn electrically connect each of the solder bumps 3 with an associated one of the board electrodes 5, and the thermosetting resin 8 turns into the reinforcing resins 6, each of which is positioned around one of the bonding members 9 to cover the bonding member 9 and the bonding region between the bonding member 9 and the solder bump 3 to reinforce them.

In the manner hereinabove described, the structure 10 on which the BGA semiconductor package 1 according to the first embodiment as shown in FIG. 1 has been mounted can be formed by the second mounting method.

(Third Mounting Method)

The third mounting method is subsequently explained. As shown in FIG. 4, a soldering paste 7 is printed only on surfaces of the board electrodes 5 of the circuit board 4. An uncured thermosetting resin 8 is then supplied on the circuit board 4 by means of screen printing or a dispenser. An area or areas to which the thermosetting resin 8 is supplied may be on or around the soldering paste 7, on all the board electrodes 5 of the circuit board 4, on a central portion or four corners of the circuit board 4, or around some of the board electrodes 5. The amount of supply of the thermosetting resin 8 is controlled so that after completion of mounting, the thermosetting resin 8 (reinforcing resin 6) can cover the bonding members 9 and the bonding regions between the bonding members 9 and the solder bumps 3, and each reinforcing resin 6 can be separated from the reinforcing resins 6 adjacent thereto without being in contact with the semiconductor package 1. In addition to such control of the amount of supply of the thermosetting resin 8, a plurality of protrusions 4a may be provided on the circuit board 4 between the board electrodes 5, as shown in FIG. 4. The protrusions 4a act to positively separate, after completion of mounting, adjacent reinforcing resins 6 from each other while increasing the joint strength between the circuit board 4 and the reinforcing resins 6. If a space S can be provided between adjacent thermosetting resins 8, any other suitable means may be employed in place of the protrusions 4a.

Thereafter, the BGA semiconductor package 1 is mounted on the circuit board 4, and the soldering paste 7 is melted for subsequent soldering with the use of a reflow soldering device. At the same time, curing of the thermosetting resin is completed. By doing so, the soldering paste 7 solidifies and turns into the bonding members 9, which in turn electrically connect each of the solder bumps 3 with an associated one of the board electrodes 5, and the thermosetting resin 8 turns into the reinforcing resins 6, each of which is positioned around one of the bonding members 9 to cover the bonding member 9 and the bonding region between the bonding member 9 and the solder bump 3 to reinforce them.

In the manner hereinabove described, the structure 10 on which the BGA semiconductor package 1 according to the first embodiment as shown in FIG. 1 has been mounted can be formed by the third mounting method.

A soldering material used for the soldering paste has a melting point less than that of a soldering material used for the solder bumps preferably by 10 degrees C. and, more preferably, by 20 degrees C. Such a difference of the melting points can allow the bonding members 9 to easily melt by reheating when the semiconductor package-mounted structure 10 is repaired, thus making it possible to enhance the repairing capability. If the difference of the melting points is considered, it is preferred that the solder bumps be made of an Sn—Ag—Cu-based soldering material, and the bonding members be made of an Sn—Bi-based soldering material.

Example

The impact resistance and the repairing capability of the structure 10 in which the BGA semiconductor package 1 has been incorporated using the above-described second mounting method were investigated by changing the kind of the soldering paste, the reflow temperature, and the amount of the reinforcing resin. FIG. 5 is a table indicating results of the investigation and particularly indicating examples 1-6 of the structure 10 according to the second mounting method and comparative examples 1-4 for comparison.

As the soldering paste 7, an Sn58Bi soldering paste (trade name "L20-BLT-5-T7F", made by Senju Metal Industry Co., Ltd.) was used. The following were also commonly used.

BGA semiconductor package 1: semiconductor package having daisy chain connection and SnAgCu balls employed as solder bumps 3

Thermosetting resin: bisphenol F-type epoxy resin (trade name "epicort 806", made by Japan Epoxy Resins Co., Ltd.)

Curing agent: imidazole curing agent (trade name "curezole 2P4Mz", made by Shikoku Chemicals. Corporation)

Viscosity controlling and thixotropy-imparting additive: castor oil-based thixotropy-imparting agent (trade name "THIXCIN R", made by Elementis Japan Corporation)

The solder bumps 3 (SnAgCu balls) have a melting point of 219 degrees C., and the soldering paste 7 (Sn56Bi soldering paste) has a melting point of 138 degrees C.

The heating temperature required for reflow of the soldering paste 7 (maximum reflow achieving temperature) is over the melting point of the soldering paste 7 and less than the melting point of the solder bumps 3. All the examples and the comparative examples were heated up to a temperature of 155 degrees C. for production of the semiconductor package-mounted structures.

In the examples 1-6 and the comparative examples 1-4, the additive amount of the thermosetting resin 8 was changed. The additive amount of the thermosetting resin 8 specifically indicated in the table of FIG. 5 was calculated based on the percentage of the height of the reinforcing resin 6 from the board electrode to the total height of the solder bump 3 and the bonding member 9 in a state after completion of mounting. The percentage of the height of the reinforcing resin 6 was set in the range of 15% to 80% in the case of examples 1-6, and set to 0% (no reinforcing resin), 5%, 10% and 100% in the case of comparative examples 1-4.

Evaluation of the BGA semiconductor package-mounted structure was conducted as follows.

A shock resistance test was Conducted to evaluate the drop life. More specifically, the semiconductor package-mounted structure was caused to drop from a height of 30 cm a number of times, and the structure was determined as defective when the resistance value of the semiconductor package increased by 20% or more. That is, the number of drops to occurrence of a defective semiconductor package is referred to as the "drop life". As the drop life, each semiconductor package-mounted structure was graded pass, allowable or fail.

The BGA semiconductor packages used here had a size of 11 mm×11 mm, and the number of the solder bumps 3 was 441 at intervals of 0.5 mm. The circuit board 4 had a size of 3 cm×7 cm and a thickness of 0.8 mm. The electrode material was copper, and the board material was glass epoxy.

The repairing capability was evaluated such that the semiconductor package-mounted structures were heated up to a temperature of 250 degrees C. using a hot plate, and after a lapse of thirty seconds, the BGA semiconductor package 1 was peeled off with a force of 10N using tweezers. Each structure was graded pass if the semiconductor package 1 could be peeled off, fail if not, or allowable if the semiconductor package 1 was in between them.

(Measurement Results)

When example 4 (height of reinforcing resin: 50%) and comparative example 3 (height of reinforcing resin: 100%) are compared, the measurement results shown in the table of FIG. 5 reveal that they are comparable in the drop life, but example 4 produces an excellent result, while comparative example 3 is considerably inferior in the repairing capability. When example 4 (height of reinforcing resin: 50%) and comparative example 4 (height of reinforcing resin: 0%) are compared, example 4 produces an excellent result, while comparative example 4 is considerably inferior in the drop life.

Also, when example 1 (height of reinforcing resin: 15%) and comparative example 2 (height of reinforcing resin: 10%) are compared, it is clear that example 1 is practically endurable because the drop life of example 1 is 40 times, while that of comparative example 2 is 25 times. Further, when example 6 (height of reinforcing resin: 80%) and comparative example 3 (height of reinforcing resin: 100%) are compared, it is clear that example 6 is practically endurable in terms of the repairing capability.

Accordingly, examples 1-6 are found to be capable of ensuring the drop life sufficient for practical use and at the same time enhancing the repairing capability. From such point of view, it is effective to set the percentage of the height of the reinforcing resin to be greater than 15%, more preferably within a range of 15%-80%. That is, it is effective to set the percentage (H/D) of the height H of the reinforcing resin 6 from the board electrode 5 to the distance D between the electrode 2 of the semiconductor package 1 and the circuit board 5 of the circuit board 4 to be greater than 15%, more preferably within a range of 15%-80%.

Although not mentioned in examples 1-6 and comparative examples 1-4, if soldering is conducted at a maximum reflow achieving temperature of 245 degrees C., it has been confirmed that a fragile Bi component is entirely dispersed and, hence, fragile composition not covered with the reinforcing resins exposes, thus lowering the drop impact resistance. On the other hand, in applications where the soldering paste, i.e., only SnBi is melted without melting the solder bumps, as in examples 1-6, it is thought that Bi is not dispersed throughout the bonding members 9, SnBi exists on a side of the circuit board 4, which is accordingly covered with the reinforcing resins 6, and no fragile composition exposes, thus resulting in an increase in the drop impact resistance.

For the above reasons, in the structure 10 according to the present invention on which the semiconductor package 1 has been mounted, when the BGA semiconductor package 1 with SnAgCu solder bumps is soldered using a low-temperature solder such as, for example, fragile SnBi, a reinforcing effect of the reinforcing resins can be obtained even if the soldering is conducted at a temperature greater than a melting point of the SnAgCu solder, but it is preferred that the soldering is conducted at a temperature below the melting point of the SnAgCu solder because a greater reinforcing effect of the reinforcing resins can be obtained.

Explanation has been made with reference to the second mounting method, but similar results can be obtained from the first or third mounting method.

FIG. 6 depicts a section of one of the bonding regions of the semiconductor package-mounted structure 10 according to the present invention, which was obtained in the manner referred to above.

In the example as shown in FIG. 6, an SnAgCu-based solder bump such as, for example, an Sn-3Ag-0.5 Cu solder bump (melting point: 219 degrees C.) was used as the solder bump 3, and the bonding member 9 was made of an SnBi-based solder, e.g., an Sn—58Bi solder (melting point: 138 degrees C.). An epoxy resin was used as the reinforcing resin 6.

In the structure 10 of FIG. 6, an outer peripheral surface of the bonding member 9 is substantially in the form of an inwardly curved ring and entirely filled, with and reinforced by the reinforcing resin 6. Such a reinforcing structure enhances the reinforcing effect of the reinforcing resin 6.

It is to be noted that, by properly combining the arbitrary embodiments of the aforementioned various embodiments, the effects possessed by them can be produced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The disclosure of specifications, drawings, and claims of Japan Patent Application No. 2008-275109 filed on Oct. 27, 2008 is incorporated herein by reference in its entirety.

INDUSTRIAL APPLICABILITY

The BGA semiconductor package-mounted structure and the method of mounting the BGA semiconductor package according to the present invention attain wide use in the field of technology for electric/electronic circuit formation, and can be used to connect electronic components such as, for example, CCD elements, hologram elements, and chips and also to join them to a board. Accordingly, the structure and method according to the present invention are also applicable to products accommodating those elements or parts or the board therein, e.g., DVDs, mobile phones, portable audio-video equipment, digital cameras, and the like.

The invention claimed is:

1. A semiconductor device mounted structure, comprising:
   a semiconductor device having a plurality of first electrodes;
   a circuit board having a plurality of second electrodes;
   a plurality of solder bumps respectively formed on the plurality of first electrodes;
   a plurality of bonding members respectively positioned between the solder bumps and the second electrodes to electrically connect the first electrodes to the second electrodes via the solder bumps, the bonding members being made of a soldering material having a melting point less than that of a soldering material used for the solder bumps; and
   a plurality of resin members respectively positioned around the bonding members so as to cover at least the bonding members and bonding regions between the bonding members and the solder bumps;
   wherein adjacent resin members are spaced away from each other without being in contact with the semiconductor device; and
   wherein a plurality of spaces are provided on the circuit board between the second electrodes to avoid contact of each resin member with the resin members adjacent thereto.

2. The semiconductor device mounted structure according to claim 1, wherein the bonding members have a melting point less than that of a soldering material used for the solder bumps by 20 degrees C. or more.

3. The semiconductor device mounted structure according to claim 1, wherein a percentage (H/D) of a height H of the resin members to a distance D between the first electrodes and the second electrodes is greater than 15%.

4. The semiconductor device mounted structure according to claim 1, wherein each of the bonding members has an outer peripheral surface in the form of an inwardly curved ring and entirely filled with an associated one of the resin members.

5. The semiconductor device mounted structure according to claim 1, further comprising another resin material positioned between the semiconductor device and the circuit board so as to cover the first electrodes, the second electrodes, the solder bumps, and the resin members.

6. The semiconductor device mounted structure according to claim 1, wherein the resin members separately cover the bonding regions between the bonding members and the solder bumps, and the resin members are separately positioned on the circuit board.

7. The semiconductor device mounted structure according to claim 1, wherein each of the resin members is constituted by a fillet that is narrowest at a location between and spaced away from the semiconductor device and the circuit board and broadens toward the circuit board.

8. The semiconductor device mounted structure according to claim 7, wherein each resin member has a broadest portion at a location contacting the circuit board and, at the location contacting the circuit board, each resin member is spaced away and separated from all of the other resin members.

9. The semiconductor device mounted structure according to claim 8, wherein the solder bumps are Sn—Ag—Cu based solder bumps.

10. The semiconductor device mounted structure according to claim 1, wherein the solder bumps are Sn—Ag—Cu based solder bumps.

11. A semiconductor device mounted structure, comprising:
- a semiconductor device having a plurality of first electrodes;
- a circuit board having a plurality of second electrodes;
- a plurality of solder bumps respectively formed on the plurality of first electrodes;
- a plurality of bonding members respectively positioned between the solder bumps and the second electrodes to electrically connect the first electrodes to the second electrodes via the solder bumps, the bonding members being made of a soldering material having a melting point less than that of a soldering material used for the solder bumps; and
- a plurality of resin members respectively positioned around the bonding members so as to cover at least the bonding members and bonding regions between the bonding members and the solder bumps;
- wherein adjacent resin members are spaced away from each other without being in contact with the semiconductor device; and
- wherein a plurality of protrusions are formed on the circuit board between the second electrodes to avoid contact of each resin member with the resin members adjacent thereto.

12. The semiconductor device mounted structure according to claim 11, wherein the solder bumps are Sn—Ag—Cu based solder bumps.

* * * * *